United States Patent
See (10) Patent No.: US 6,170,066 B1
(45) Date of Patent: Jan. 2, 2001

(54) POWER-OFF RECOVERY MANAGEMENT FOR SECTOR BASED FLASH MEDIA MANAGERS

(75) Inventor: Deborah See, Placerville, CA (US)

(73) Assignee: Intel Corporation, Santa Clara, CA (US)

(*) Notice: Under 35 U.S.C. 154(b), the term of this patent shall be extended for 0 days.

(21) Appl. No.: 08/927,833

(22) Filed: Sep. 11, 1997

Related U.S. Application Data (63) Continuation of application No. 08/536,088, filed on Sep. 29, 1995.

(51) Int. Cl.[7] .............................. H02H 3/05; H05K 10/00
(52) U.S. Cl. .............................................. 714/22; 713/340
(58) Field of Search .................................. 714/22, 14, 15, 714/16; 713/300, 330, 340; 365/185.33, 218

(56) References Cited

U.S. PATENT DOCUMENTS

| | | | |
|---|---|---|---|
| 5,265,230 | * 11/1993 | Saldanha et al. | 395/425 |
| 5,341,339 | * 8/1994 | Wells | 365/218 |
| 5,369,616 | * 11/1994 | Wells | 365/218 |
| 5,457,658 | * 10/1995 | Niijima et al. | 365/218 |
| 5,473,753 | * 12/1995 | Wells | 395/182.03 |
| 5,491,809 | * 2/1996 | Coffman | 395/430 |
| 5,524,230 | * 6/1996 | Sakaue | 395/430 |
| 5,544,119 | * 8/1996 | Wells | 365/185.11 |
| 5,548,784 | * 8/1996 | Easley, Jr. et al. | 395/838 |
| 5,598,370 | * 1/1997 | Niijima et al. | 365/185.33 |
| 5,602,987 | 2/1997 | Harari et al. | 395/182.06 |
| 5,619,481 | * 4/1997 | Hosoya | 369/32 |

* cited by examiner

*Primary Examiner*—Dieu-Minh T. Le
(74) *Attorney, Agent, or Firm*—Blakely, Sokoloff, Taylor & Zafman LLP (57) ABSTRACT

A method of managing data in a flash EEPROM memory array allows all data to be recovered after power loss except new data in a sector in which the data content is being changed when power is lost. The method includes providing a block data structure and a plurality of sector data structures in each block of a flash EEPROM memory array, each data structure storing an indication of the operating state of the block or an associated physical sector of the array; changing the indication stored in the block data structure or the sector data structure when the operating state of the block or the associated sector changes; detecting the indication stored in the block data structure and the sector data structures when power is restored to a system which has lost power; and managing the flash EEPROM memory array depending on the indications detected.

15 Claims, 5 Drawing Sheets

| Condition of Status Bits | | | | Block Status |
|---|---|---|---|---|
| 1 | 1 | 1 | 1 | Erased |
| 1 | 1 | 1 | 0 | Recover |
| 1 | 1 | 0 | 0 | Erasing |
| 1 | 0 | 0 | 0 | Write |
| 0 | 0 | 0 | 0 | Full |

| Status Bit 3 | Status Bit 2 | Status Bit 1 | Status Bit 0 | Erase Block | Erase Block | Erase Block | Erase Block | Erase Block | Erase Block | Erase Block | Erase Block |
|---|---|---|---|---|---|---|---|---|---|---|---|
| X | X | X | X | | | | | | | | |

Figure 5

| Condition of Status Bits | | | | Sector Status |
|---|---|---|---|---|
| 1 | 1 | 1 | 1 | Free |
| 1 | 1 | 0 | 1 | Allocating |
| 1 | 0 | 0 | 1 | Allocated |
| 1 | 0 | 0 | 0 | Valid |
| 0 | 0 | 0 | 0 | Invalid |

| Status Bit 3 | Status Bit 2 | Status Bit 1 | Status Bit 0 | Logical Address | Logical Address | Logical Address | Logical Address | Logical Address | Logical Address | Logical Address | Logical Address |
|---|---|---|---|---|---|---|---|---|---|---|---|
| | | | | | | | | | | | |

POWER-OFF RECOVERY MANAGEMENT FOR SECTOR BASED FLASH MEDIA MANAGERS

This is a continuation of application Ser. No. 08/536,088, filed Sep. 29, 1995.

BACKGROUND OF THE INVENTION

1. Field of the Invention

This invention relates to electronic systems utilizing flash electrically-erasable programmable read-only memory (EEPROM) and, more particularly, to methods and apparatus for managing data in such systems to reduce data loss in case of a power interruption.

2. History of the Prior Art

Recently, flash EEPROM storage devices have been used in arrays as a new form of memory array. A flash EEPROM memory array is constructed of a large plurality of floating-gate metal-oxide-silicon field effect transistor devices arranged as memory cells in typical row and column fashion with circuitry for accessing individual cells and placing the memory transistors of those cells in different memory conditions. Such memory transistors may be programmed by storing a charge on the floating gate. This charge remains when power is removed from the array. This charge (typically called a "zero" or programmed condition) or its absence (a "one" or erased condition) may be detected when the memory cell is read.

These flash memory arrays may be designed to accomplish many of the operations previously accomplished by other forms of memory in digital systems and especially in computer and control systems. For example, flash memory is being used to replace various read-only memories such as the basic input/output startup (BIOS) memory of a computer system. The ability to program flash memory in place offers substantial advantages for BIOS and similar read only memories over more conventional EPROM memory. Because of this ability, its great insensibility to mechanical shock, and its very high reliability, flash memory is also being used in embedded systems to store data generated by operations of associated systems. More recently, flash memory has been used to provide a smaller lighter functional equivalent of an electromechanical hard disk drive. Flash memory is useful for this purpose because it may be read more rapidly and is not as sensitive to physical damage as an electromechanical hard disk drive. Flash drive memories are especially useful in portable devices where space is at a premium and weight is extremely important.

In general, a flash EEPROM memory array is divided into blocks which are connected so that each entire block of memory cells may be erased simultaneously. An erasure places all of the memory cells in the block into the erased condition. Thereafter, a memory cell may be individually programmed to store data. Since all of the memory transistors of a block of the array are joined so that they may be erased together, a cell in a programmed condition cannot be switched to the erased state until the entire block of the array is erased. Contrasted to other memories in which changed data is written, essentially instantaneously, directly in place of the data it replaces, a flash EEPROM memory array requires a time consuming erasure process. Because flash memory is erased in blocks, out-of-date information cannot be erased without erasing all of the valid information that remains in the block along with the invalid information. Consequently, when the information at a data entry changes in flash memory used to store changing information, the new information is written to a new memory area rather than written over the old data; and the old data is marked as invalid. Then, after a sufficient portion of a block has been marked invalid, all valid information remaining in the block is written to the new memory area; and the entire block may then be erased, typically using a background process.

Since the processes by which data is written to and erased from a flash memory array are quite complicated, these processes require significant periods to accomplish. During these periods, it is possible for a system which uses such a flash memory array to lose power. If a system loses power during a write operation which updates data already stored, for example, there is a significant possibility that data will be lost. This is particularly true in embedded systems which utilize flash memory arrays. Embedded systems try to utilize as much of the flash memory as possible for accomplishing their prime purposes and consequently provide minimal data management facilities. In some flash memories, especially those used in embedded systems, a power loss may cause the entire disk to be corrupted and all of the data lost.

It is desirable to provide a low overhead system and apparatus for managing the write and erase processes of flash memory arrays in order to obviate the problems which bring about a significant loss of data.

SUMMARY OF THE INVENTION

It is, therefore, an object of the present invention to provide improved low overhead apparatus and a method for managing flash memory to obviate the loss of data and formatting during power losses.

This and other objects of the present invention are realized by a method of managing data in a flash EEPROM memory array so that all data can be recovered after power loss except the new data in a sector in which the data content is being changed when power is lost, the method including providing a block data structure and a plurality of sector data structures in each block of a flash EEPROM memory array, each data structure storing an indication of the operating state of the block or an associated physical sector of the array; changing the indication stored in the block data structure or the sector data structure when the operating state of the block or of the associated sector changes; detecting the indication stored in the block data structure and the sector data structures when power is restored to a system which has lost power; and managing the flash EEPROM memory array depending on the indications detected.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
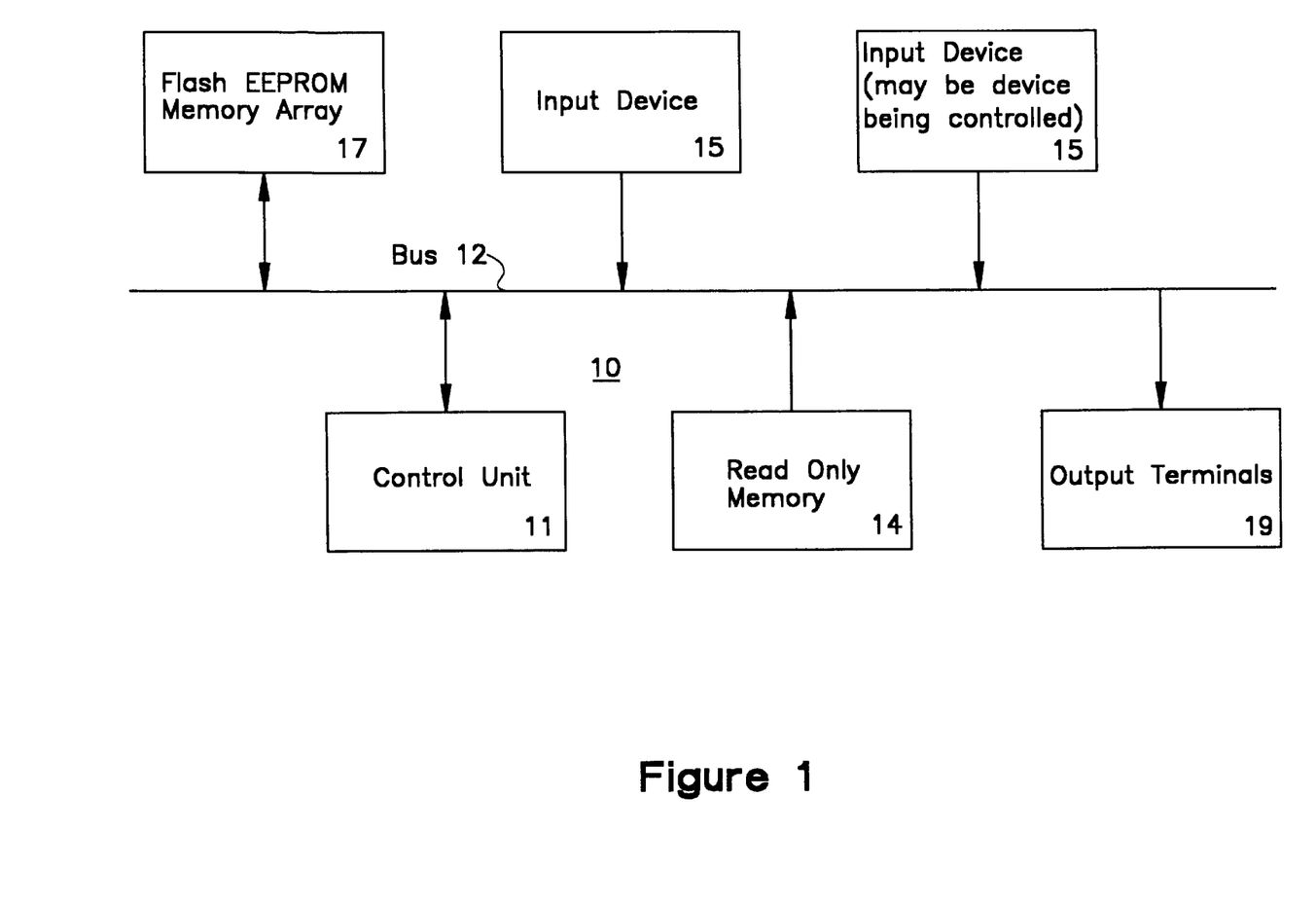
FIG. 1 is a block diagram of an embedded system designed in accordance with the present invention.

Referring now to FIG. 1, there is illustrated an embedded control system 10 configured in accordance with one embodiment of the present invention. The system 10 illustrated includes a control unit (controller) 11 which executes the various instructions provided to control the operations of the system 10. In particular systems, the control unit 11 may be an actual controller which includes only the typical limited functions necessary to carry out its limited functions; in other systems, the control unit 11 may be a microprocessor capable of general purpose use. Where the control unit 11 is a microprocessor, it is typically joined through a bus 12 to a read only memory (ROM) circuit 14 which provides the processes for controlling the operations conducted by the control unit 11. The memory circuit 14 may be an EPROM memory array, a flash EEPROM memory array, or another type of memory array used to provide control processes in the prior art. In a typical system 10 using a microprocessor, various input devices 15 are connected to the bus 12 to furnish data which the control unit 11 may write to a flash EEPROM memory array 17. A number of output terminals 19 may be provided. In a system 10 using an actual controller, the data input devices 15, the memory circuit 14, the flash memory array 17, and any associated components may be connected to the controller directly through individual interfaces rather than a bus.

In some typical embedded systems, data is provided to the control unit 11 at the input devices 15 by an associated system being monitored and is stored in the flash EEPROM memory array 17. As the data is accumulated, processes are run which cause the control unit 11 to utilize that data to produce output signals for varying the operation of the associated system. In general, an embedded system provides only sufficient functional components and operating processes to carry out the purposes for which the control system is designed. Where the purpose of the system is to store data generated by some associated system and manipulate that data to provide specific outputs, the primary components and processes needed in the system 10 are ones sufficient to accomplish the writing of the data provided by the associated system and to manipulate that data in the prescribed manner. Since the system 10 need accomplish only a few primary tasks, the overhead required has typically been kept low so that the amount of the flash memory actually used for storage may be kept very large.

Because of the manner in which data is written to and erased from flash memory, there must be flash management processes to write the data as it is gathered and the results as the data is manipulated, to modify the data as new data is gathered, to read the data stored, and to erase the data when the data stored has become invalid. Typically, these processes utilize a significant amount of the data space provided by the flash memory array in order to store control data used in the processes. Since the amount of available memory space in an embedded system is always significantly limited, to date this memory space has been insufficient to allow the inclusion of any processes for recovery of the data due to the loss of power during operation. Because there has been no system for file recovery, the loss of power has often caused not only loss of data but loss of formatting so that the flash memory has become useless. The only known method to recover data for such embedded systems has been to run very large processes on a desktop computer to which the flash memory module has been connected after its removal from the embedded system.

Figure 2:
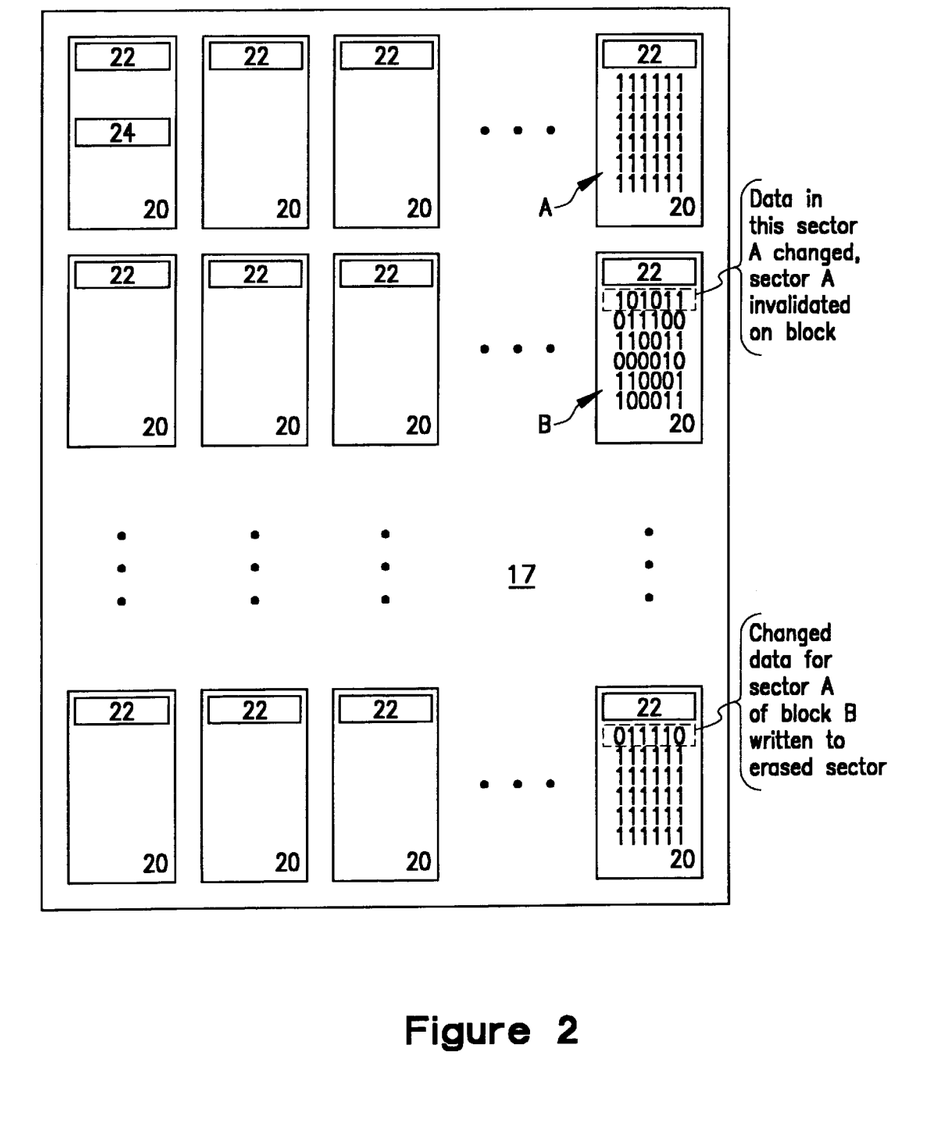
FIG. 2 is a block diagram of a flash memory array designed in accordance with the prior art.

FIG. 2 is a block diagram of a prior art flash EEPROM memory module 17 which has been used in embedded systems such as that generally described in FIG. 1. The module 17 is divided into a number of blocks 20 each of which may be independently erased. Each of these blocks 20 includes flash memory cells joined in logical row and column arrangement. Any particular memory cell is accessed by selecting its row and column in the manner in which data is accessed in dynamic random access memory (DRAM).

In contrast to DRAM, however, flash disk memory is typically provided signals which indicate a logical position at which the data is to be stored. Often the data appears at the interface in terms which relate to rotating devices. For example, commands often relate to seeking sectors of data, to writing sectors of data, and similar parameters which have significance to rotating storage devices such as electromechanical hard disk drives. Data is furnished and is typically stored in each of the blocks 20 of the module 17 in the sectors typically associated with electromechanical hard disk drives.

For this reason, the control unit 11 and the read only memory 14 must together provide what is referred to as a media manager which controls the accessing of the array. The media manager includes, among other things, control processes for translating the logical information furnished for accessing the array into physical positions in the blocks of the module. To accomplish this, the control processes cause one or more mapping structures 24 to be stored in the module 17; such mapping structures provide translations from logical address data furnished by the system to physical positions of the data on blocks. Such mapping structures may be stored in a single block 20 of the array as a single map 24 in the manner shown, may be distributed throughout the blocks, or may be a combination of both arrangements, the particular arrangement depending on the particular media manager. Moreover, each block of the flash array usually stores data in a tracking information table 22 which indicates the status of data on that particular block. This information may indicate where in the block particular sectors of data are stored, whether data is actually stored in a particular sector, and the logical type of data stored in the sector. Where the mapping structure 24 is distributed throughout the array, it may be combined with the tracking information tables 22 of each block.

In prior art arrangements, when data is first written to an array, that data is typically written to an empty (erased) block (see block 20A) on a sector by sector basis. As the data is written, the mapping structure and the tracking table for that block are updated. When one block has been filled (see block 20B), the writing of more data continues on a next empty block and the map and the tracking table for that block are updated. When data at a particular sector is changed and must be rewritten, the data already stored at that sector (see sector A in block 20B) cannot be erased unless all of the data on the block is erased. Consequently, the changed data is written to an empty sector on a block (see block 20C) which has not yet been filled and the map and tracking table on the new block are updated.

Since the data cannot simply be written over the old data, the blocks of the flash array will gradually fill. To keep the array from filling, the media manager typically carries on a continuing background process by which the block having the smallest number of valid entries is erased. This process includes writing all valid entries on the block to empty space on a block which has not yet been filled, updating the maps and tables, marking all of the entries on the old block invalid, and finally erasing the old block so that it may be put back into use as an empty block.

As is known to those skilled in the art, flash memory arrays are not written in the same manner as DRAM or other memory. When DRAM or a form of magnetic memory is written, the states of all of the bits being written change essentially together. When a word or byte of flash memory is written, the current requirements to charge the floating gates are much higher, so the devices are often pulsed over and over until they arrive at the proper charge condition. The devices being written do not switch at once so the state of the flash memory cells may vary from completely unwritten through random to completely written. If power is lost during writing of a sector, the state of the memory cells in that sector may be any of these states.

Similarly, it takes much more current to discharge the floating gates of the flash devices because the charge is greater and the erase process necessary before writing first places all flash devices in the charged state and then discharges all of the devices by application of large potential differences. Some of the flash devices are easier to charge and discharge than others. Consequently, when a block is erased, some devices switch before others. If power is lost during erasure of a block, the state of the memory cells on that block may be anything from the original state to entirely erased and may easily be entirely random. If the block is in its original state, two blocks having the same data will exist which may not be distinguishable. If the block contains memory cells in random states, all of the data on the block is useless but will not be so marked.

The latency involved in each of the writing and erasing processes used for flash EEPROM memory arrays makes the loss of significant amounts of data and of formatting quite possible in prior art flash EEPROM memory arrays if power is lost. This is especially true in embedded systems which lack any data recovery processes. Since the logical-to-physical mapping and the various formatting data are typically stored in the flash array, the mapping and any formatting provided on any block which is being written or erased when a power loss occurs may be rendered useless as well as other data. In a system which utilizes a media manager to provide a MS DOS or similar type of file system, allocation tables stored in the array must be constantly rewritten and may be adversely affected in this manner so that all formatting is lost.

The present invention overcomes the prior art problems by providing processes which occupy a small amount of read only memory and utilize a very small amount of the flash media yet as run by the media manager guarantee that no more than a single sector of data, the sector to which data is being written, will be lost in case of a power failure during operation of an embedded system.

Figure 3:
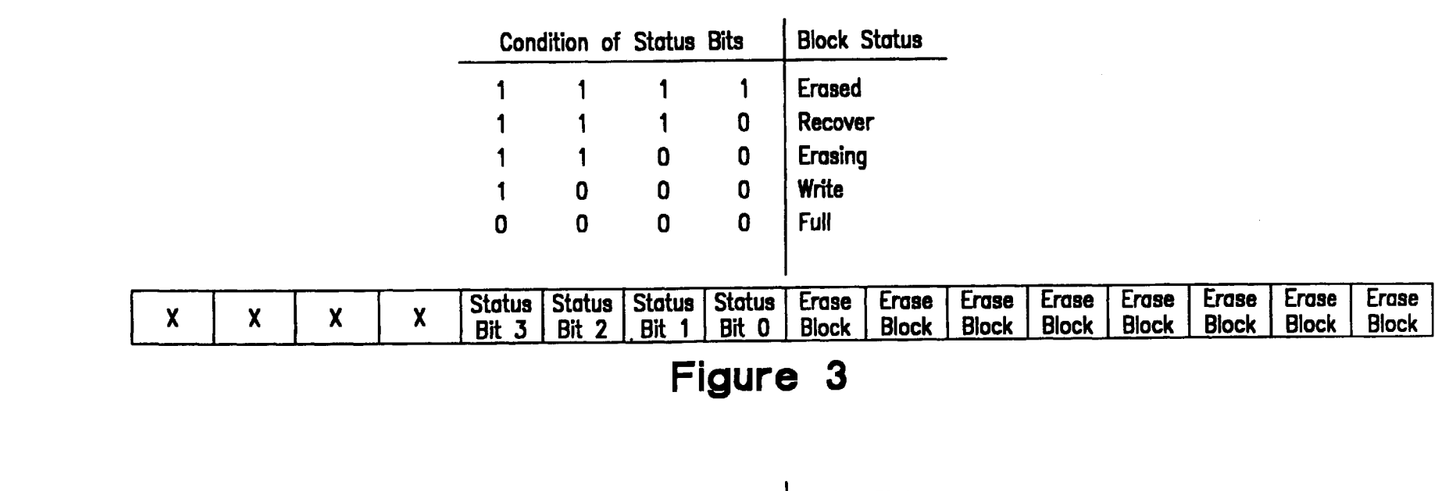
FIG. 3 is a diagram illustrating a first data structure created in accordance with the invention on each block of a flash memory array.

According to the present invention, the media manager creates on each block of the array a block status area. A block status area used in a particular embodiment is illustrated in FIG. 3. Storage is provided in the block status area of each block for an indication of the status of that block. In one embodiment, the block status area includes two bytes. Of these two bytes, four status bits indicate the condition of the block. The conditions which may be represented in this embodiment are "erased," "recover", "erasing," "write", and "full." In addition to the block status bits, there is storage in the two bytes of the block status area for a block address.

Figure 4:
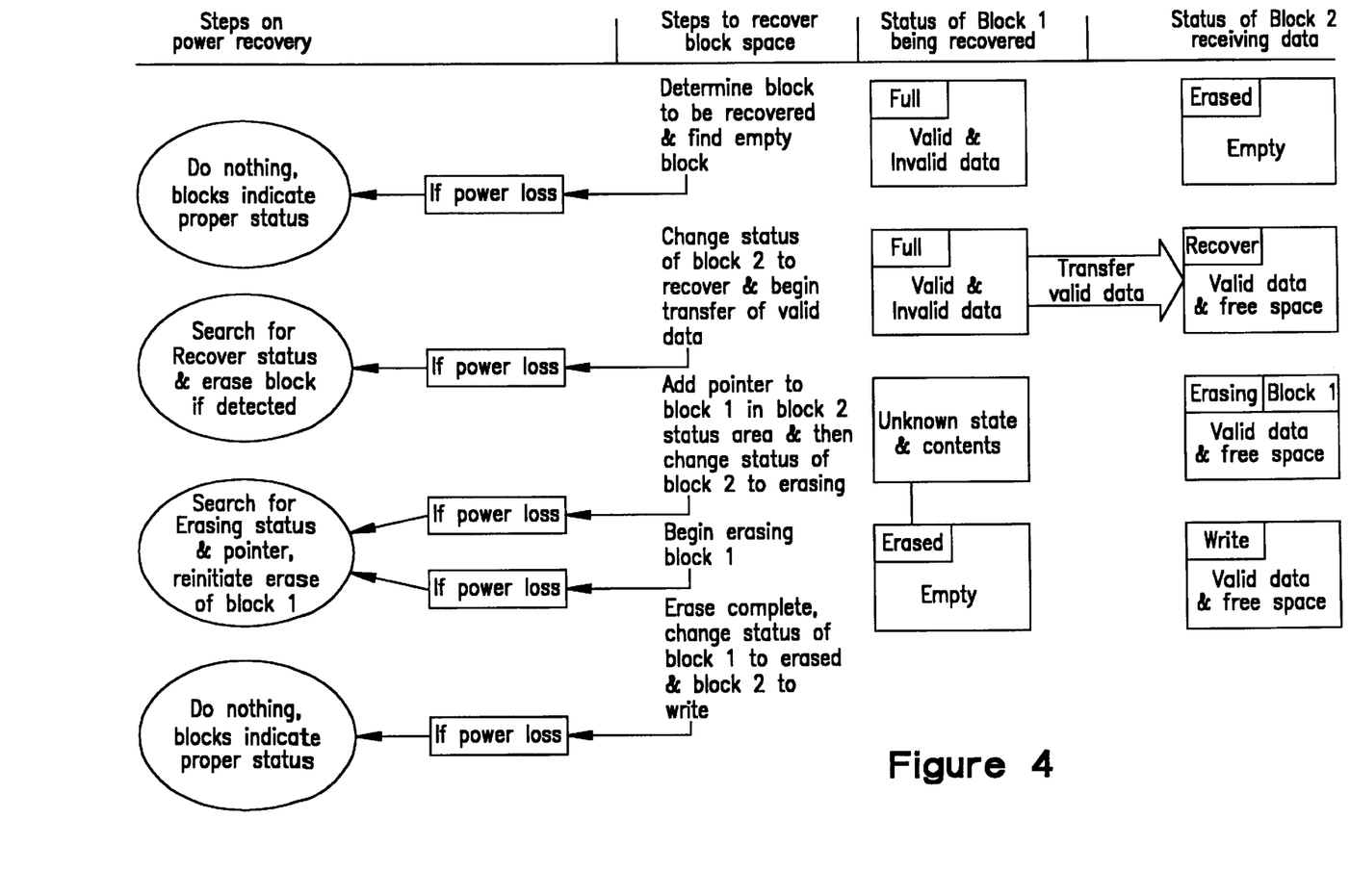
FIG. 4 is a block diagram of a flash memory array designed in accordance with the present invention and a process in accordance with the present invention for using the array in the system of FIG. 1.

FIG. 4 shows a number of blocks including block status areas and illustrates a media manager process in accordance with the invention. When a block is erased, the status bits of that empty block (e.g., the initial state of block 2) are marked by the media manager to indicate the block is empty. In one embodiment, empty is indicated by all four bits being placed in the one or erased condition (the condition in which they are naturally placed as the block is erased). A block which is full of data (e.g., the initial state of block 1) and from which data may be transferred out to an empty sector of a block (block 2) having free space is marked as "full" in its block status area by the media manager to indicate that it contains no free space to which data may be written. In the embodiment described in FIG. 3, "full" is indicated by all four status bits being placed in the zero or programmed condition.

When a transfer of valid data from a "full" block (block 1) begins in order to reclaim the invalid space on the block by erasing the entire block, the four status bits of the empty block (block 2) are changed by the media manager from "erased" to "recover." In the embodiment described in FIG. 3, the "recover" status is indicated by changing the lowest order bit of the four status bits (which are initially in the one state to indicate the "erased" state) into the zero or programmed condition. Thus, only a single bit need be changed to indicate this next status; and this bit may be changed by a simple write eliminating the possibility of ambiguous states. During the "recover" state, the valid data on the "full" block is copied to the previously erased block the status of which indicates the "recover" state. In the meantime, the status of the "full" block remains unchanged.

If power is lost during the period while data is being transferred to the block (block 2) in the "recover" state, the media manager searches for the status conditions of the blocks. If a block is found having the status "recover" without more, the media manager knows that the recover process was not completed so that the valid data has not been completely transferred from the "full" block to the "recover" block. With this knowledge, the media manager places the "recover" block (block 2) in the queue of blocks to be erased. On the other hand, the "full" block (block 1) is still marked "full" and will in due course have the process of transferring its valid data and erasing the block begun over again.

When a transfer of data from a "full" block to an empty block has been completed without a power failure, the media manager adds the block name of, or some pointer to, the "full" block (block 1) to the block status area of the "recover" block (block 2) along with the status bits which continue to indicate the "recover" state. In one embodiment (shown in FIG. 3), the block name is indicated by eight additional bits. Should a power loss occur at this point before anything else takes place in the process, the search by the media manager after power returns indicates a block in the "recover" stage but with a pointer to a block from which data has been completely transferred. This indication informs the media manager that the block in the "recover" state is now complete and the formatting tables and mapping structures may be updated. It also indicates to the media manager that the block indicated by the pointer may be placed in the erase queue.

When a transfer of data from a "full" block to an empty block has been completed and the pointer to the "full" block from which the valid data was transferred has been added by the media manager to the block status table without a power failure, the block status table of the recovered block (block 2) is further updated by the media manager marking the status bits to indicate the "erasing" state while leaving the block number of the block which is to be erased (block 1) in the pointer area of the block status area. In one embodiment shown in FIG. 3, the next lowest order bit of the four status bits is placed in the programmed or zero state. Again, a change of state requires writing only a single bit. At this point the actual erasure of the block from which the valid data has been recovered may be undertaken. If power is lost at this stage of the process, the media manager will discover the "erasing" status indication in the status table of the block (block 2) to which the valid data has been transferred and know that the block indicated by the number (block 1) still has to be erased while valid data is stored in the block with the "erasing" status (block 2).

The status indications of the two blocks being described remain in these conditions ("erasing"/"pointer," and "full") until the erasure is complete. When the media manager finishes erasing, the status indication for the erased block (block 1) is switched to "erased" (typically by the erasing process itself); and the status of the block containing valid data (block 2) is changed to "write" indicating that the block now contains free space. In one embodiment shown in FIG. 3, this is done by the media manager programming the third lowest bit of the status bits to a zero condition, again a write of only a single bit to change states. If the array loses power at this point, each of the blocks is detected in its correct condition by the media manager when power returns, the "erased" block as empty and usable, the block with valid data as containing valid data and empty sectors to which data may still be written.

The block in the "write" state (block 2) remains in this state as it accumulates more data until it ultimately fills. When the block fills, the status bits are marked to indicate the "full" state. In one embodiment shown in FIG. 3, this is accomplished by the media manager programming the most significant of the status bits to a zero state, another single bit write to change the state. This indicates to the media manager that the block is full and should be considered when a determination is made of a next block from which data should be recovered.

The next state into which the block in the "erased" state (block 1) will be placed depends on the details of the flash array. If it is the only block in the empty or "erased" condition, then it will probably be used by the media manager to immediately recover valid data from and erase that one of the "full" blocks with the least amount of valid data. This will take place according to the process described above. If there are more empty blocks than one, the block may be selected by the media manager as the next block to which new or modified data is to be written. In such a case, when the data has been written to the erased block, its status is changed to "write" to indicate that it contains valid data and empty space to receive additional data. From this point, the status of the block progresses to "full" and then through the process described.

Thus, as may be seen, by the addition of a very small number of bits which serve as a status area on each block, approximately two bytes in the described embodiment, and a process which tests for status when power is applied to the system, an absolute determination of the status of the different blocks may be determined. This is a very low overhead for a flash memory array.

Figure 5:
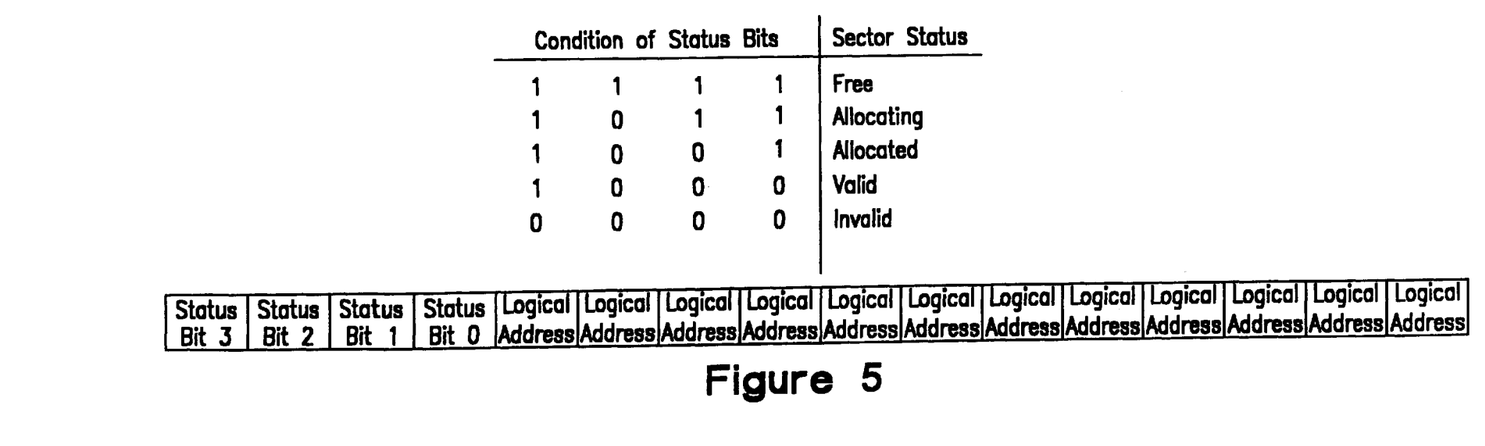
FIG. 5 is a diagram illustrating a second data structure created in accordance with the invention on each block of a flash memory array.
Figure 6:
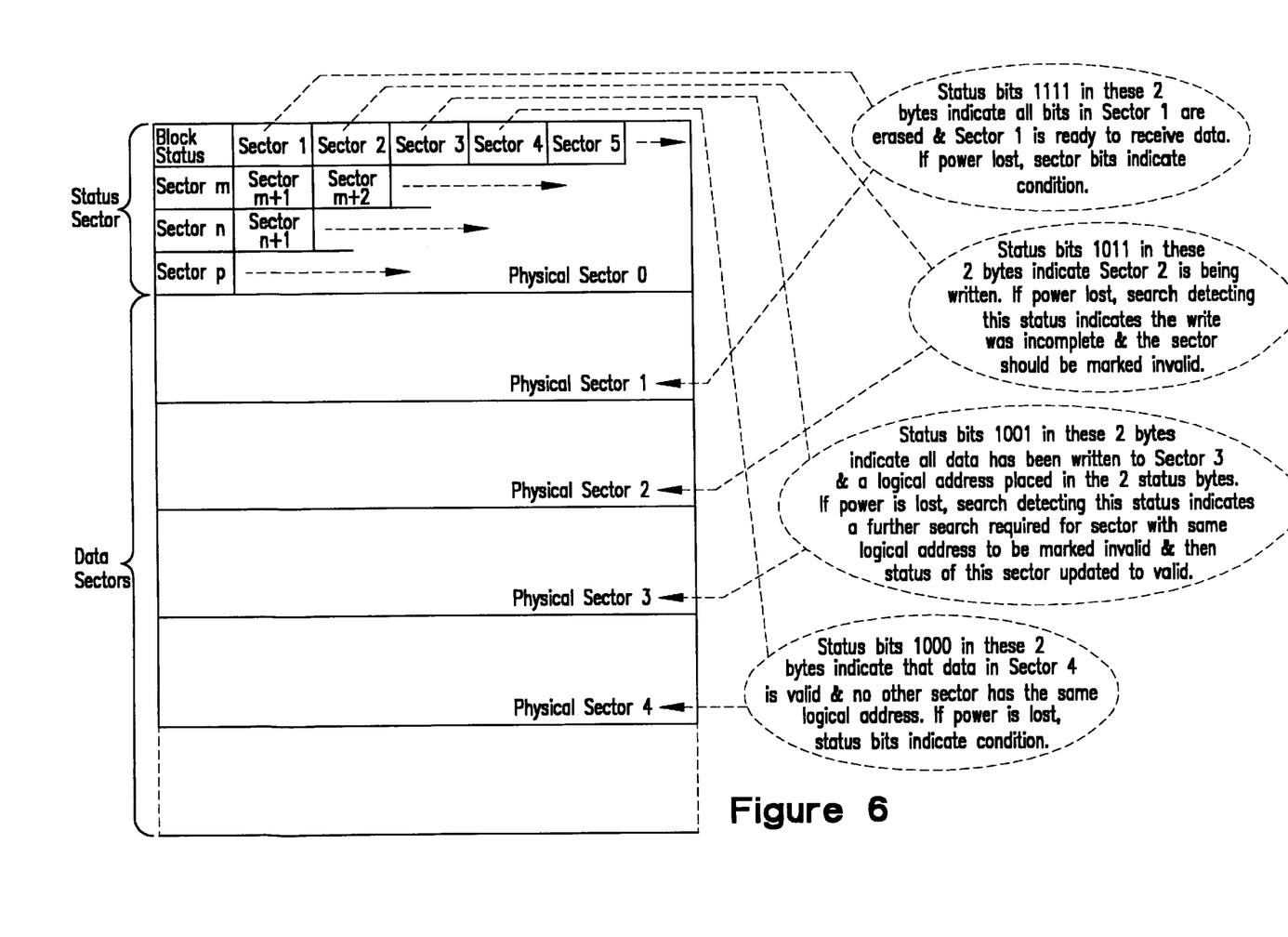
FIG. 6 is a diagram illustrating the storage of data in a single block of a flash memory array designed in accordance with the present invention.

In order to know the exact status of data on a block in case of a loss of power, the status of the individual sectors making up each block may also be tracked in accordance with the present invention. To accomplish this, a sector status table such as that illustrated in the embodiment shown in FIG. 5 may be constructed by the media manager for each sector on each block of the array. In one embodiment illustrated in FIG. 6, the sector status tables for all of the sectors on a block are combined in a single table arranged in one sector of the block. This sector contains the status tables for the block and each of the sectors arranged in serial order. As is shown in FIG. 5, a sector status table may include two bytes of which the four most significant bits indicate the status of a particular sector and the lower order bits indicate the logical address of the sector. Thus, the sector status table combines the mapping structure and sector tracking formatting in the embodiment illustrated. The different conditions which may be provided by the media manager in the sector status table of the embodiment shown include "free," "allocating," "allocated," "valid," and "invalid."

In the embodiment illustrated, the "free" status represented by four erased bits (ones) indicates that the sector is in the "erased" state. This is the condition into which the bits are naturally placed when a block is erased. If a power loss occurs while a sector is in the "free" state, a search by the media manager when power returns will indicate that such a sector is still erased and ready to receive data.

When a write commences to a sector, its sector status is changed by the media manager from "free" to "allocating". This is accomplished in the embodiment illustrated by writing a zero to the second most significant one of the sector status bits. It will be noted that only a single bit need be written to accomplish this change from the "free" condition to the status indication for the "allocating" state. In the "allocating" state, data is being written to a sector. If a power loss occurs while a sector is in the "allocating" state, a search by the media manager when power returns will indicate that such a sector should be discarded because the data in that sector is in an indeterminable state.

When all data has been written to a sector without incurring a power loss, a logical sector number is assigned to the sector in the translation map and the sector status of the sector is changed by the media manager from "allocating" to "allocated". This is accomplished in the embodiment illustrated by writing a zero to the third most significant bit of the sector status bits. It will be noted that only a single bit need be written to accomplish this change from the status indication for the "allocating" condition to that indicating the "allocated" state. In the "allocated" state, data has been written to a sector. However, if the reason for the writing is either because the data already in the logical sector has changed or because a "full" block is about to be erased and the valid data is being recovered, two sectors with the same logical number may occur. If a power loss occurs while a sector is in the "allocated" state, a search by the media manager when power returns may indicate that another sector exists with the same logical number. If such a sector is found, the media manager marks the sector not in the "allocated" state as "invalid" because the data in that sector has been replaced by the data in the "allocated" sector.

Once the media manager has marked any sector with a duplicate logical number as "invalid" without incurring a power loss, the sector status of the sector is changed by the media manager from "allocated" to "valid." This is accomplished in the embodiment illustrated by writing a zero to the least significant bit of the four sector status bits. It will be noted that only a single bit need be written to accomplish this change from the status indication for the "allocated" condition to that indicating the "valid" state. In the "valid" state, data has been written to a sector and all steps have been completed to provide the status of the sector and the data in it so that the data in it will not be lost if power is lost. If a power loss occurs while a sector is in the "valid" state, nothing is required of the media manager to recover data in the sector except where two sectors with the same logical number are found. If one sector is in the "valid" state and the other in the "allocated" state, then the data in the sector in the "valid" state has been rewritten or changed and placed in the sector in the "allocated" state (as explained above). In this case, the status of the sector marked "valid" is changed to "invalid". In the embodiment shown, a sector is marked "invalid" by programming all four bits of the status to zero. Since the writing of the sector status occurs when a sector is in the "valid" state, the requires writing on a single bit to the most significant bit position in the embodiment shown.

Thus, as with the tracking of status for the individual blocks of the array, the tracking of individual sectors in each block provides an accurate and exact indication of the position of valid and invalid data while using a very small amount of array overhead. Moreover, the only necessary increases in processes for causing the controller 11 to carry out the functions of the media manager described over those of the prior art are the few instructions necessary to make the searches and comparisons described above. Consequently, the present invention makes it practical to include control processes which preclude significant data loss when power is lost in the systems with which the invention is used.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method of managing data in a nonvolatile memory comprising:
   providing a plurality of sector data structures in said memory, each sector data structure for storing a status of one associated sector;
   changing status of a selected sector from a first status value indicating an erased state to a second status value indicating an allocating state when commencing a write operation to said selected sector;
   changing said status of said selected sector to a third status value indicating an allocated state after completing said write operation; and
   changing said status of said selected sector to a fourth status value indicating a valid state after searching for a valid sector with a same sector number and changing status of said valid sector to a fifth status value indicating an invalid state.

2. The method of claim 1 further comprising searching for any allocating sectors having status equal to said second status value when power is reapplied to said nonvolatile memory and changing status of said allocating sectors to said fifth status value.

3. The method of claim 1 further comprising searching for any allocated sectors having status equal to said third status value when power is reapplied to said nonvolatile memory and changing status of said allocated sectors to said fourth status value.

4. The method of claim 1 further comprising searching for any allocated sectors having status equal to said third status value when power is reapplied to said nonvolatile memory, searching for a valid sector having a same sector number as any of said allocated sectors and having a status of said fourth status value, and changing status of said valid sector to said fifth status value.

5. The method of claim 1 wherein said nonvolatile memory is a flash electrically erasable programmable read only memory.

6. The method of claim 1 wherein values of successive states vary by a single bit.

7. A method of tracking the status of individual sectors within a nonvolatile memory array divided into a plurality of blocks, each block having at least one sector, comprising:
   changing a selected status of a selected sector from a first status value indicating an erased state to a second status value indicating an allocating state when commencing a write operation to said selected sector;
   changing said selected status to a third status value indicating an allocated state after completing said write operation;
   changing said selected status to a fourth status value indicating a valid state after searching for a valid sector with a same sector number and changing status of said valid sector to a fifth status value indicating an invalid state;
   searching for any allocating sectors having status equal to said second status value when power is reapplied to said nonvolatile memory and changing status of said allocating sectors to said fifth status value; and
   searching for any allocated sectors having status equal to said third status value when power is reapplied to said nonvolatile memory and changing status of said allocated sectors to said fourth status value.

8. The method of claim 7 further comprising searching for any allocated sectors having status equal to said third status value when power is reapplied to said nonvolatile memory, searching for a valid sector having a same sector number as any of said allocated sectors and having a status of said fourth status value, and changing status of said valid sector to said fifth status value.

9. The method of claim 7 wherein said nonvolatile memory is a flash electrically erasable programmable read only memory.

10. The method of claim 7 wherein values of successive states vary by a single bit.

11. A power-loss data recovery system for flash memory comprising:

at least two blocks of flash memory cells wherein all cells of a block being connected to be erased together, each block comprising at least one sector;

a plurality of sector data structures in said flash memory, each sector data structure for storing a status of one associated sector; and  a media manager coupled to said flash memory for managing status of said sectors, said managing comprising   changing status of a selected sector from a first status value indicating an erased state to a second status value indicating an allocating state when commencing a write operation to said selected sector;

changing said selected status to a third status value indicating an allocated state after completing said write operation; and   changing said selected status to a fourth status value indicating a valid state after searching for a valid sector with a same sector number and changing status of said valid sector to a fifth status value indicating an invalid state.

12. The system of claim 11 wherein said managing further comprises searching for any allocating sectors having status equal to said second status value when power is reapplied to said nonvolatile memory and changing status of said allocating sectors to said fifth status value.

13. The system of claim 11 wherein said managing further comprises searching for any allocated sectors having status equal to said third status value when power is reapplied to said nonvolatile memory and changing status of said allocated sectors to said fourth status value.

14. The system of claim 11 wherein said managing further comprises searching for any allocated sectors having status equal to said third status value when power is reapplied to said nonvolatile memory, searching for a valid sector having a same sector number as any of said allocated sectors and having a status of said fourth status value, and changing status of said valid sector to said fifth status value.

15. The system of claim 11 wherein values of successive state vary by a single bit.

\* \* \* \* \*